(12) United States Patent
Guiol

(10) Patent No.: US 6,207,893 B1
(45) Date of Patent: Mar. 27, 2001

(54) HIGH FREQUENCY SHIELDED DUCT

(75) Inventor: Eric Guiol, Malsch (DE)

(73) Assignee: Schroff GmbH, Straunbenhardt (DE)

( * ) Notice: Subject to any disclaimer, the term of this patent is extended or adjusted under 35 U.S.C. 154(b) by 0 days.

(21) Appl. No.: 09/374,061

(22) Filed: Aug. 13, 1999

(30) Foreign Application Priority Data

Aug. 27, 1998 (DE) ............................................. 198 38 951

(51) Int. Cl.[7] ................................................. H05K 9/00
(52) U.S. Cl. ...................... 174/35 R; 174/65 R; 174/68.3
(58) Field of Search ............................... 174/35 R, 65 R, 174/68.3, 68.1, 36, 35 MS, 35 TS, 35 GC

(56) References Cited

U.S. PATENT DOCUMENTS

| | | | |
|---|---|---|---|
| 3,686,607 | * | 8/1972 | Berry ..................................... 338/66 |
| 4,066,837 | * | 1/1978 | Miura ............................... 174/35 GC |
| 4,358,632 | * | 11/1982 | Buch ............................... 174/35 MS |
| 4,506,224 | * | 3/1985 | Krause ................................. 324/319 |
| 4,746,866 | * | 5/1988 | Roschmann .......................... 324/318 |
| 5,294,748 | * | 3/1994 | Schwenk et al. .................. 174/35 R |
| 5,898,344 | * | 4/1999 | Hayashi ................................. 331/67 |
| 6,093,962 | * | 7/2000 | Ikegame ............................... 257/728 |

FOREIGN PATENT DOCUMENTS

| | | |
|---|---|---|
| 40 13 886 A1 | 10/1991 | (DE) . |
| 40 13 963 C2 | 7/1993 | (DE) . |
| 196 04 219 C1 | 6/1997 | (DE) . |

* cited by examiner

Primary Examiner—Adolf Deneke Berhane
(74) Attorney, Agent, or Firm—Merchant & Gould P.C.

(57) ABSTRACT

A high frequency shielded duct for a shielded cable 1 runs through the wall 2 of an electrically conductive housing 3 and contains a channel 4 with a resilient-flexible contact element and is situated on the housing 3. The cable 1 lies with its bare metal shield contacting the base 15 of the channel longitudinally where it is pressed into place by the contact element. The flue 5, formed by the channel 4, represents a wave duct with high absorption and prevents the passage of high frequency electromagnetic waves.

11 Claims, 2 Drawing Sheets

HIGH FREQUENCY SHIELDED DUCT

BACKGROUND OF THE INVENTION

The invention concerns a high frequency shielded duct with a shielded cable running through the wall of an electrically conductive housing for electrical and electronic components.

The high frequency shielded duct finds application in high frequency shielded housings and cabinets of industrial electronics, in which elements and modules are accommodated. These elements and modules are sensitive to electromagnetic interfering radiation and their components can also produce interfering radiation, which must not be allowed to penetrate outward.

Increasingly components are built into housings and cabinets of electrical engineering or rather electronics. These housings necessitate an increasingly smaller noise margin due to ever lowering voltage levels and higher switching frequencies. With shielded systems it is well known that the cable ducts are the critical points at which high frequency interference currents on the cable shields are often not sufficiently drawn off and thereby the put into question the entire complex shielding of the housing or cabinet.

There are different well-known high frequency shielded ducts for use with shielded unfinished single cables (those without a plug connected), which cause a perfect electrical contacting of the cable's shield with the high frequency shielded duct. Common to all of these ducts is the lavish cost of assembly for bringing the cable into the duct. It is particularly unfavorable that the mounting of the plug connectors to the cable ends is possible often only after final assembly of the duct at the housing or cabinet. This means that additional work is expended at the place of assembly. Thus stripping, splicing, attaching the fastening piece, and soldering must be executed before the cabinet or the housing can be set up and attached to its workstation. In an electrically shielded connector with a metallic housing, according to DE 40 13 963, after removing the cable sheath, a sleeve must be put on over the cable shield. The opened shield is then brought down and fastened to the outside diameter of the case. In another design of ducts the opened cable shield is dragged through a metal pan filled with metal balls, such that the shield makes contact with the wall of the metal housing over the balls.

It is also well known, high frequency shielded cable entry housing, to fasten an assembly disk to the inside of the housing wall next to an opening for the cable passage. The duct channels are intended to have tension relievers for the cables, which are fastened to the mounting plate. The installation and attachment of the cables is however time-consuming; already made cables complete with plugs cannot be pulled through the channels (DE 40 13 886).

Further known is a switch cabinet with a high frequency shielded duct for cable consisting of two, inserted floor plates arranged at the base. These plates possess sealing strips of a flexible, electrically conductive material at bent edgings between which the cables, with their bare metal shield, are held. The assembly of the two floor plates and the use of cables is pedantic however (DE 196 04 219).

The task of the invention lies therein, to develop a high frequency shielded duct for shielded cables in such a way that a single or several cables including their plug connectors can be passed through the wall of an electrically conductive housing with the least assembly expenditure.

SUMMARY OF THE INVENTION

The solution of the task is solved by a metallic channel arranged on the wall of an electrically screened conductive housing. A cable can be led into this housing and is inserted after the spreading of its shield in the longitudinal direction, whereby, a resilient flexible contact element is then inserted into the channel and presses the shield in slightly to produce a linear shaped contact along the channel wall.

The invention makes use of the effect a high frequency electromagnetic wave has passing through a flue, as the closed channel represents here. The wave is strongly absorbed until one of the flue's dependent threshold frequency measurements is reached. It has been shown that after a suitable dimensioning of the channel, an outstanding high frequency shielded duct results and needs only an electrical connection, provided between the cable's shield and the inner wall of the channel. Here the contact pressure is not important.

The suggested duct with its resilient-flexible contact element permits the insertion of several cables next to each other and also allows different diameter cables into the channel as long as only one linear shaped contact is produced between the cable shield and an inner wall of the channel.

In relation to other well-known ducts, the invention also has the advantage that an insertion of coaxial cables leaves no junction for the characteristic impedance to occur. There is also no impairment when assembling the metallic shield—as for instance during a splicing process.

The assembly required by cables and cable bundles in connection with a duct, according to the invention, requires neither special know-how nor special processes, except when removing the sheath of a short piece of cable. Thus no special qualification demands are made on the assembly personnel. The otherwise necessary time-consuming fastening of the plug connectors is omitted on site because ready-made cables can be used.

The channel possesses a favorable u-shaped cross section. This results in easily calculable absorption rates of the flue, which is formed by the channel as well as the adjacent wall. A wave duct of rectangular cross section is thereby formed.

For attachment to the housing the channel will appropriately have mounting flanges on its open long sides and on its end wall. A channel that is equipped in such a way is cost effectively manufactured through punching and bending processes and is then screwed on to the wall of the metal housing without problems.

It is appropriate to design a tension relief for the cable at the base of the channel close to the inlet. Beyond the tension relief the position of the cable is thereby fixed at the wall of the flue.

In the simplest case a commercial cable clamp made from anticorrosive sheet metal serves as a tension relief.

The contact element can be a prismatic block from a suitable, long-lasting, and resistant foam material or from another resilient-flexible material which will evenly fill out the channel.

In order to ensure that the contact portion of the cable's shield is also at the end wall of the channel, the contact portion is upwardly curved and right-angled before it meets closely with the end wall.

Several channels can be arranged next to each other or also on top of each other on one of the outside walls of the housing.

The invention is more nearly described below by two model examples with reference to the attached drawings. Shown are:

DETAILED DESCRIPTION OF THE PREFERRED EMBODIMENT

Figure 1:
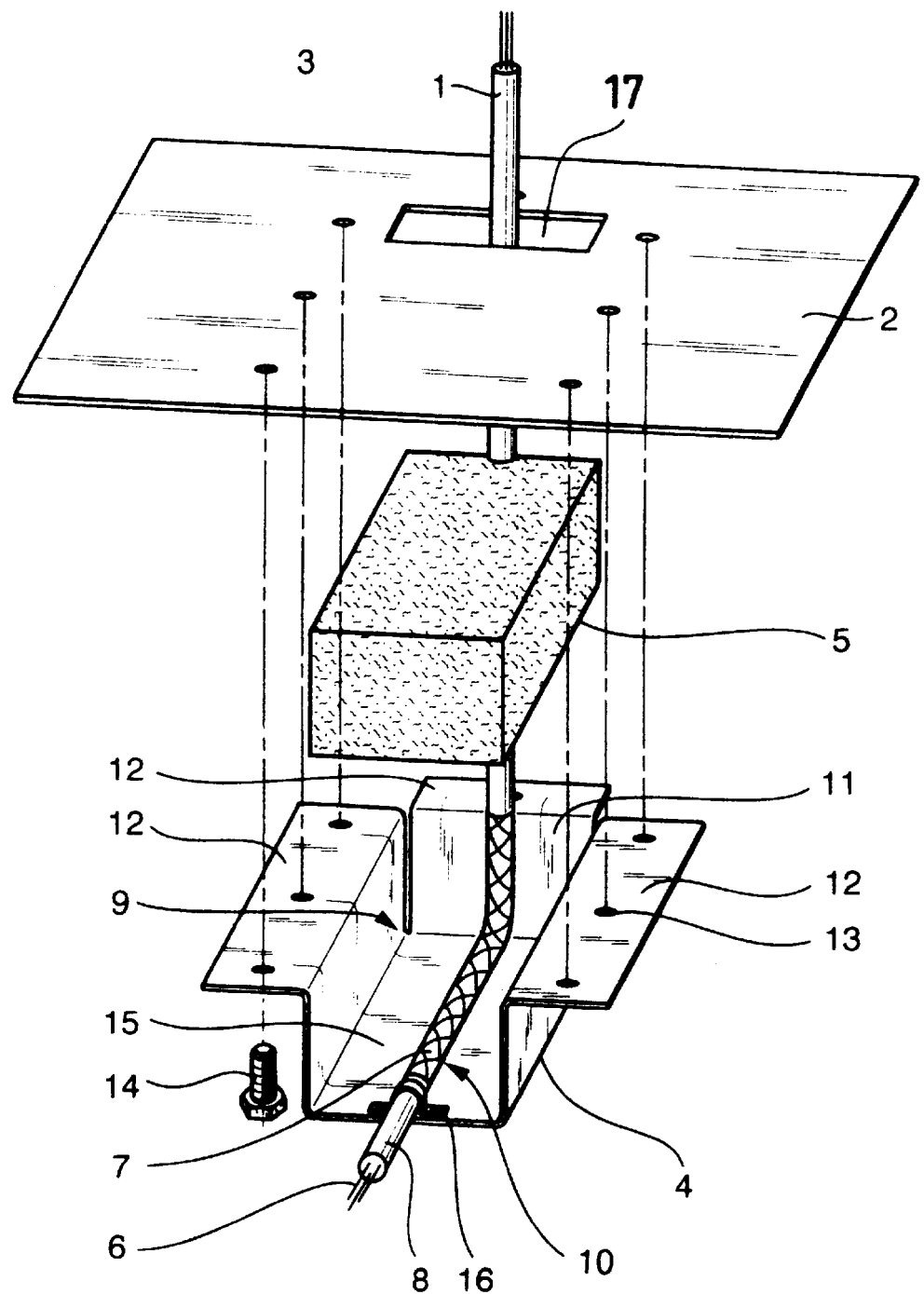
FIG. 1 a high frequency shielded cable duct represented in an enlarged perspective, FIG. 2 several ducts arranged next to each other for several cables, in perspective.

According to the invention, a shielded cable's 1 high frequency shielded duct runs through the wall 2 of an electrically conductive housing 3, for the accommodation of electrical and electronic components, and contains a channel 4 and a contact element 5.

The cable 1 possesses several conductors 6 isolated from one another, which are surrounded by a shield 7 made from a metal braid, as well as a sheath 8 whose outer skin is made from an insulating material.

The housing 3, of which only one section of an even wall 2 is represented in FIG. 1, serves to accommodate different electrical and/or electronic components and elements, which are either very sensitive in relation to high frequency electromagnetic disturbances or produce such disturbances.

The channel 4 is made from an electrically conductive material, is prismatic, and has a u-shaped cross section. When installed, the channel 4 is located at the wall 2 of the housing 3 and rests with the edges of its open long side 9 close against the wall 2 and is electrically conductive.

The open end wall of channel 4 serves as an inlet 10 for the cable, whereas the other end wall 11, which lies across from the former opening, is closed.

Along its open long side 9 and at the end wall 11, the channel 4, which is manufactured in bent sections, has mounting flanges 12 with mounting holes 13. Identically aligned holes are found in the wall 2 of the housing 3 for the fixing bolts 14. Near the inlet 10 at the base 15 of the channel a tension relief is designed in the shape of a cable clamp.

The sheath 8 of the cable 1 corresponds in distance to the length of the channel 4 until it reaches the shield 7, such that the shield is without covering. The cable 1 with its electrically conductive shield 7, lies in the longitudinal direction of the channel 4 on the channel wall, i.e. on the base 15. Before it reaches the end wall 11, the cable is curved high at a right-angle to the open long side 9 and from there follows the channel 4 out and is led through a rectangular opening 17 in the wall 2 and inserted into the housing 3.

The contact element 5 is a prismatic block from a resilient-flexible material and is made from foam material or soft rubber. It is placed over the cable 1 into the channel 4 and fills it out completely. Through this contact element 5 the cable 1, with its shield 7 towards the channel wall of the base 15, is evenly pressed and mechanically fixed in place.

Figure 2:
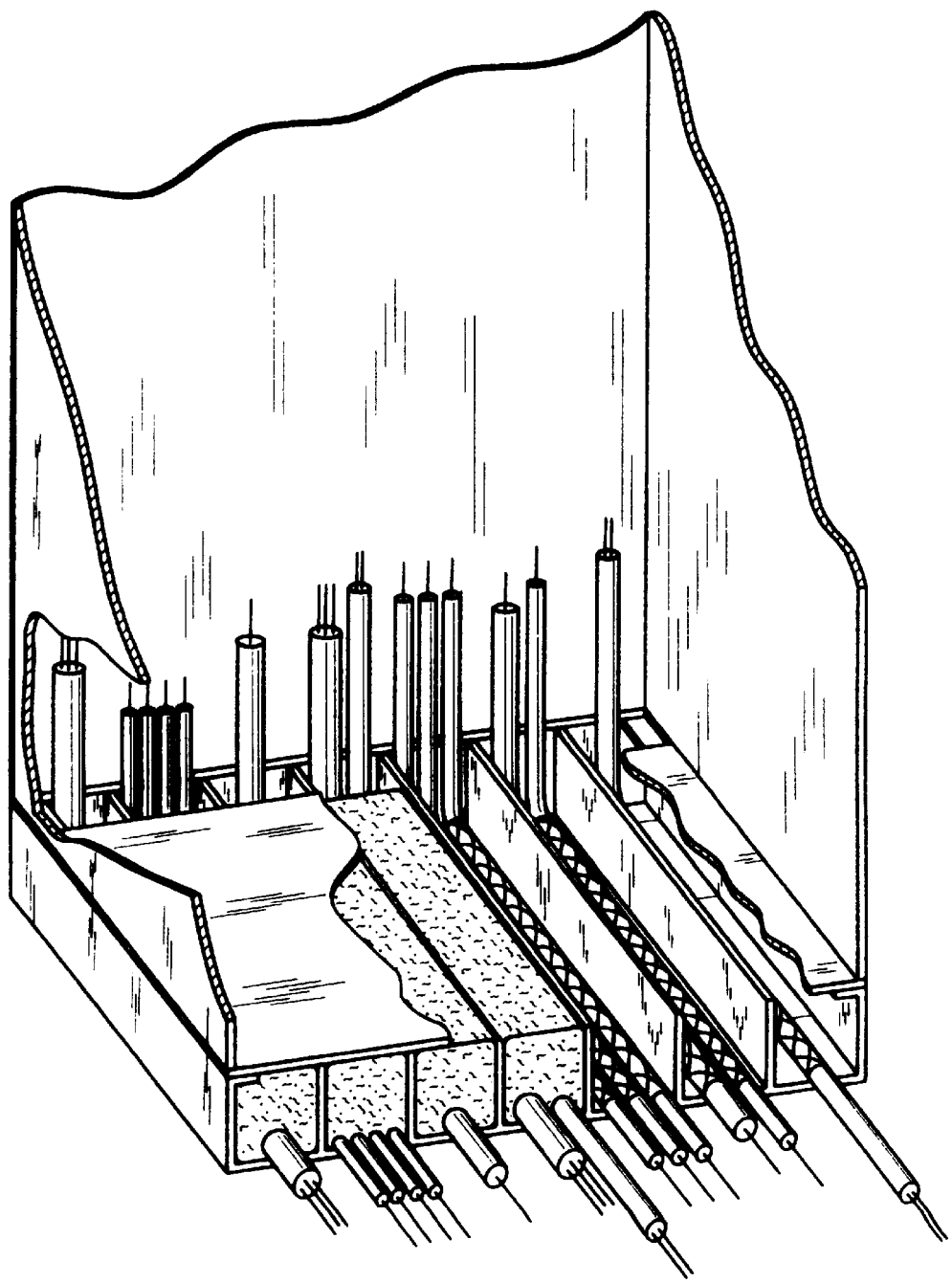

FIG. 2 shows, in u-shaped cross section, the base area of another housing made of metal on which seven high frequency shielded ducts in the form of channels are fastened to the base plate and attached next to each other. For clarification of the representation the base plate of the housing is partly cut open. In three of the channels, one, two, or three cables are situated openly on the base next to each other before the appropriate, prismatic contact elements are used. These channels possess common partitions and a common rear, end wall. The contact elements extend in longitudinal direction until they closely reach the end wall, so that a space remains there for leading the cables, bent at right-angle's, out into the housing.

What is claimed is:

1. A high frequency shielded duct for at least one shielded cable through a wall of an electrically conductive housing for electrical and electronic components, comprising:

a channel (4) of electrically conductive material, wherein the channel (4) is attached to the wall (2) of the housing (3), and the channel (4) is situated with its open long side (9) proximate the wall (2), wherein the channel includes an open end wall as an inlet (10) for the cable (1);

wherein the cable has a sheath (8) as long as the channel (4) up to its shield (7), wherein the cable (1) lies in a longitudinal direction in the channel (4), and the shield (7) lies electrically conductive in the channel (4);

a resilient-flexible contact element (5) placed into the channel (4), wherein the contact element (5) presses the shield (7) against the wall of the channel (4), and at the end of the channel the cable (1) is led out of the channel (4) and into the housing.

2. A high frequency shielded duct according to claim 1, wherein the channel (4) has a substantially u-shaped cross section.

3. A high frequency shielded duct according to claim 1, wherein an end wall (11) is across from the inlet.

4. A high frequency shielded duct according to claim 1, further comprising mounting flanges (12) along the channel's (4) open long sides (9) and on the end wall (11).

5. A high frequency shielded duct according to claim 1, wherein a tension relief (16) is provided for the cable (1) at the base (15) of the channel (4) near the inlet (10).

6. A high frequency shielded duct according to claim 5, wherein the tension relief (16) comprises a cable clamp.

7. A high frequency shielded duct according to claim 1, wherein the contact element (5) in the channel (4) comprises a block of resilient-flexible filling material.

8. A high frequency shielded duct according to claim 7, wherein the block comprises foam material.

9. A high frequency shielded duct according to claim 3, wherein the cable (1) is right-angled and curved upward at a close distance to the end wall (11).

10. A high frequency shielded duct according to claim 1, wherein a plurality of channels are arranged next to each other on an external wall of an electrically conductive housing.

11. A high frequency shielded duct for a cable having shielding and passing through the wall of an electrically conductive housing for electrical and electronic components, the duct comprising:

an electrically conductive channel element attached to a wall of the housing with an open side of the channel proximate the wall of the housing, wherein the channel includes an open end receiving the cable;

wherein the cable lies longitudinally in the channel and includes a sheath extending along the cable to the cable shielding and an end of the cable extends from the channel element into the housing, and wherein the shielding is electrically conductive to the channel element; and a resilient contact element inserting in the channel pressing the shielding against a wall of the channel element.

* * * * *